(12) United States Patent
Jang et al.

(10) Patent No.: US 12,219,725 B2
(45) Date of Patent: Feb. 4, 2025

(54) DISPLAY DEVICE

(71) Applicant: Samsung Display Co., LTD., Yongin-si (KR)

(72) Inventors: Woo Guen Jang, Yongin-si (KR); Won Tae Kim, Yongin-si (KR); Soo Hyun Moon, Yongin-si (KR); Jun Seok Min, Yongin-si (KR); Hae Ju Yun, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 204 days.

(21) Appl. No.: 18/095,236

(22) Filed: Jan. 10, 2023

(65) Prior Publication Data
US 2023/0225068 A1    Jul. 13, 2023

(30) Foreign Application Priority Data

Jan. 12, 2022   (KR) .................. 10-2022-0004885

(51) Int. Cl.
*H05K 5/02*       (2006.01)
*H05K 1/11*       (2006.01)

(52) U.S. Cl.
CPC ......... *H05K 5/0247* (2013.01); *H05K 5/0217* (2013.01)

(58) Field of Classification Search
CPC .............................. H05K 5/0247; H05K 1/118
See application file for complete search history.

(56) References Cited

U.S. PATENT DOCUMENTS

| | | | |
|---|---|---|---|
| 9,860,353 B2 | 1/2018 | Lee et al. | |
| 10,694,625 B2 | 6/2020 | Park et al. | |
| 10,777,102 B2 | 9/2020 | Cho et al. | |
| 2016/0322724 A1* | 11/2016 | Lee | H01R 12/771 |
| 2017/0223851 A1* | 8/2017 | Okuda | G06F 3/0416 |
| 2017/0238437 A1* | 8/2017 | Ishida | H05K 7/04 |
| | | | 361/800 |
| 2019/0265537 A1* | 8/2019 | Fu | H01R 12/79 |
| 2020/0035186 A1* | 1/2020 | Sasaki | G09G 3/006 |
| 2020/0044375 A1* | 2/2020 | Lee | H01R 12/7076 |
| 2020/0214127 A1* | 7/2020 | Choi | H05K 1/189 |
| 2021/0074733 A1* | 3/2021 | Huang | H01L 23/49838 |
| 2022/0312606 A1 | 9/2022 | Jin et al. | |

FOREIGN PATENT DOCUMENTS

| | | |
|---|---|---|
| KR | 10-2017-0132931 | 12/2017 |
| KR | 10-2019-0049454 | 5/2019 |
| KR | 10-2020-0004003 | 1/2020 |
| KR | 10-2300024 | 9/2021 |
| KR | 10-2022-0134854 | 10/2022 |

\* cited by examiner

*Primary Examiner* — Sherman Ng
(74) *Attorney, Agent, or Firm* — KILE PARK REED & HOUTTEMAN PLLC

(57) ABSTRACT

A display device may include a display panel which is flexible and includes a first surface on which an image is displayed and a second surface on which the image is not displayed, a connection film at least partially overlapping a side of the display panel in a plan view, a printed circuit board at least partially overlapping a side of the connection film in a plan view and electrically connected to the connection film, a control board spaced apart from the printed circuit board, and a cable electrically connecting the printed circuit board and the control board. The cable may have a spiral shape.

18 Claims, 15 Drawing Sheets

DISPLAY DEVICE

CROSS REFERENCE TO RELATED APPLICATION(S)

This application claims priority and benefits of Korean Patent Application No. 10-2022-0004885 under 35 U.S.C. § 119, filed in the Korean Intellectual Property Office on Jan. 12, 2022, the entire contents of which are incorporated herein by reference.

BACKGROUND

1. Technical Field

The disclosure relates to a display device capable of minimizing a space for mounting a cable in a housing and efficiently using a space of a rollable display device.

2. Description of the Related Art

The importance of display devices as portable information media has been emphasized because of the increasing developments and demand for information technology.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device capable of minimizing a space for mounting a cable in a housing and efficiently using a space of a rollable display device.

However, embodiments of the disclosure are not limited to those set forth herein. The above and other embodiments will become more apparent to one of ordinary skill in the art to which the disclosure pertains by referencing the detailed description of the disclosure given below.

A display device according to an embodiment includes a display panel which is flexible and includes a first surface on which an image is displayed and a second surface on which the image is not displayed, a connection film at least partially overlapping a side of the display panel in a plan view, a printed circuit board at least partially overlapping a side of the connection film in a plan view and electrically connected to the connection film, a control board spaced apart from the printed circuit board, and a cable electrically connecting the printed circuit board and the control board, and the cable has a spiral shape.

The cable may include a curvature portion having the spiral shape, a first straight line portion extending in a different direction from the spiral shape, and a second straight line portion extending in a different direction from the spiral shape.

The display device may further include a housing accommodating the display panel, and a cylinder positioned inside the housing. The cylinder may wind and deploy the display panel.

The connection film and the printed circuit board may be positioned inside the cylinder, and the control board may be positioned inside the housing.

The cylinder may include a first opening on an upper surface of the cylinder and a second opening on a side surface of the cylinder. The connection film and the printed circuit board may be accommodated inside the cylinder through the first opening, and the printed circuit board may be electrically connected to the control board through the cable positioned in the second opening.

The first straight line portion and the curvature portion may be positioned inside the cylinder, and the second straight line portion may be positioned in the second opening.

The first straight line portion may be electrically connected to the printed circuit board, and the second straight line portion may be electrically connected to the control board.

The connection film and the printed circuit board may be positioned outside the cylinder, and the control board may be positioned inside the housing.

The cylinder may include a first opening on an upper surface of the cylinder and a second opening on a side surface of the cylinder, the display panel may be accommodated inside the cylinder through the first opening, and the printed circuit board may be electrically connected to the control board through the cable positioned in the second opening.

The cable may extend in a first direction through the first opening and may extend in a second direction perpendicular to the first direction through the second opening.

The first straight line portion may extend in the first direction and the second direction and may be disposed in a vertical shape.

The first straight line portion and the curvature portion may be positioned inside the cylinder, and the second straight line portion may be positioned in the second opening.

The first straight line portion may be spaced apart from the second surface of the display panel.

The display device may further include a support portion covering the cable and the second surface of the display panel. The support portion may be disposed on the second surface of the display panel.

The cylinder may include a first cylinder accommodating the display panel and a second cylinder accommodating the cable.

A display device according to an embodiment includes a display panel which is flexible and includes a first surface on which an image is displayed and a second surface on which the image is not displayed, a connection film at least partially overlapping a side of the display panel in a plan view, a printed circuit board at least partially overlapping a side of the connection film in a plan view and electrically connected to the connection film, a control board spaced apart from the printed circuit board, and a cable electrically connecting the printed circuit board and the control board. The cable has a foldable shape.

The cable may include a plurality of portions, and each portion of the cable may be folded along a fold line.

The plurality of portions may be folded to at least partially overlap in a plan view.

The display device may further include a housing accommodating the display panel, and a cylinder positioned inside the housing. The cylinder may wind and deploy the display panel, and the connection film and the printed circuit board may be positioned outside the cylinder.

The display device may further include an accommodating box that accommodates the cable.

According to an embodiment, since a shape of the cable is variously implemented according to positions of the printed circuit board and the control board, a space for mounting the cable in the housing may be minimized and a space of a rollable display device may be efficiently utilized.

An effect according to an embodiment is not limited by the above exemplified contents, and more various effects are included in the specification.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
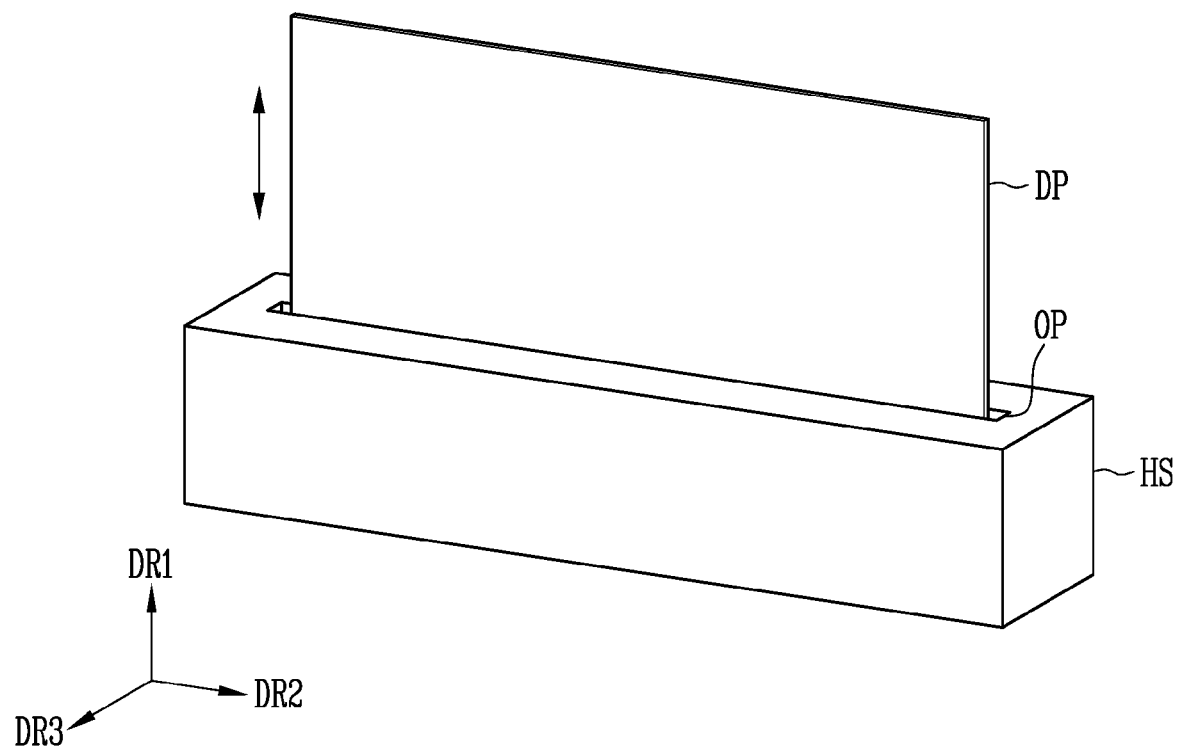
FIGS. 1 and 2 are schematic perspective views illustrating a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing exemplary features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

Although the terms "first." "second." etc. may be used herein to describe various types of elements, these elements should not be limited by these terms. These terms are used to distinguish one component from another component. Thus, a first element discussed below could be termed a second element without departing the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms of "comprises," "comprising," "includes," "have," and/or "including," when used in this specification, specify the presence of stated features, integers, steps, operations, elements, components, and/or groups thereof, but do not preclude the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art. When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Various embodiments are described with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2:
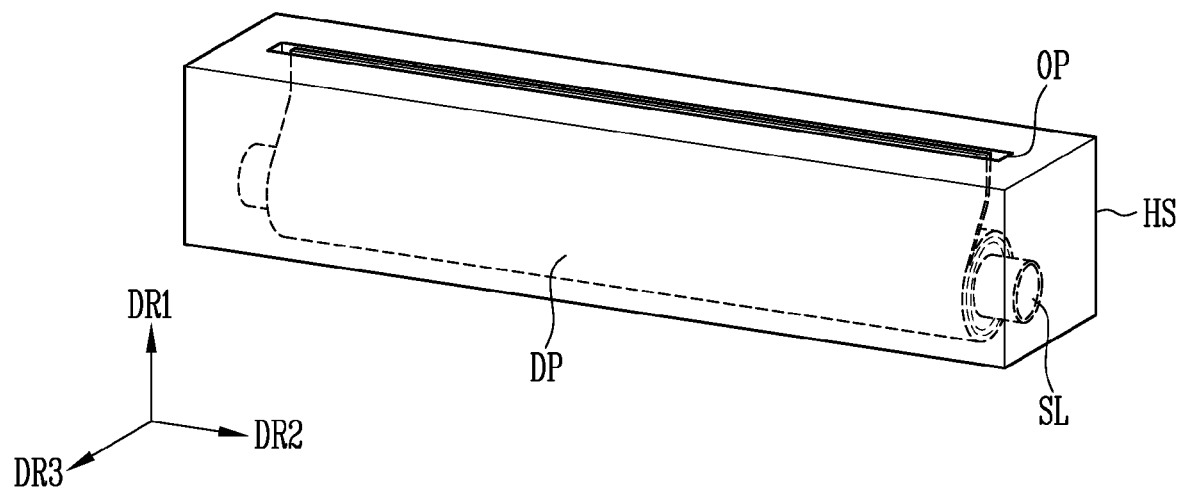

FIGS. 1 and 2 are schematic perspective views illustrating a display device according to an embodiment.

The display device according to an embodiment may correspond to a rollable display device. The rollable display device of FIG. 1 is unrolled, and the rollable display device of FIG. 2 is rolled up.

Referring to FIGS. 1 and 2, the display device according to an embodiment may include a display panel DP, a cylinder SL, and a housing HS.

The display panel DP may be a flexible display panel, and may correspond to a rollable display panel.

The cylinder SL may be positioned inside the housing HS. The display panel DP may be wound or deployed along the cylinder SL with a curvature. The cylinder SL may include an opening (not shown). A connection film, a control board, and the like may be connected to the display panel DP through the opening of the cylinder SL, and may be accommodated (or disposed) in the cylinder SL.

The housing HS may include an opening OP on a side surface, and the display panel DP may move in and out of the housing HS in a first direction DR1 through the opening OP. A shape of the opening OP may correspond to a cross-sectional shape of the display panel DP. For example, when a cross-section of the display panel DP is a quadrangle shape, the shape of the opening OP may be a quadrangle shape, but the disclosure is not limited thereto.

The housing HS may further include a motor capable of winding or deploying the display panel DP by rotating the cylinder SL, and may further include a fixing member for fixing and/or supporting the cylinder SL.

Figure 3:
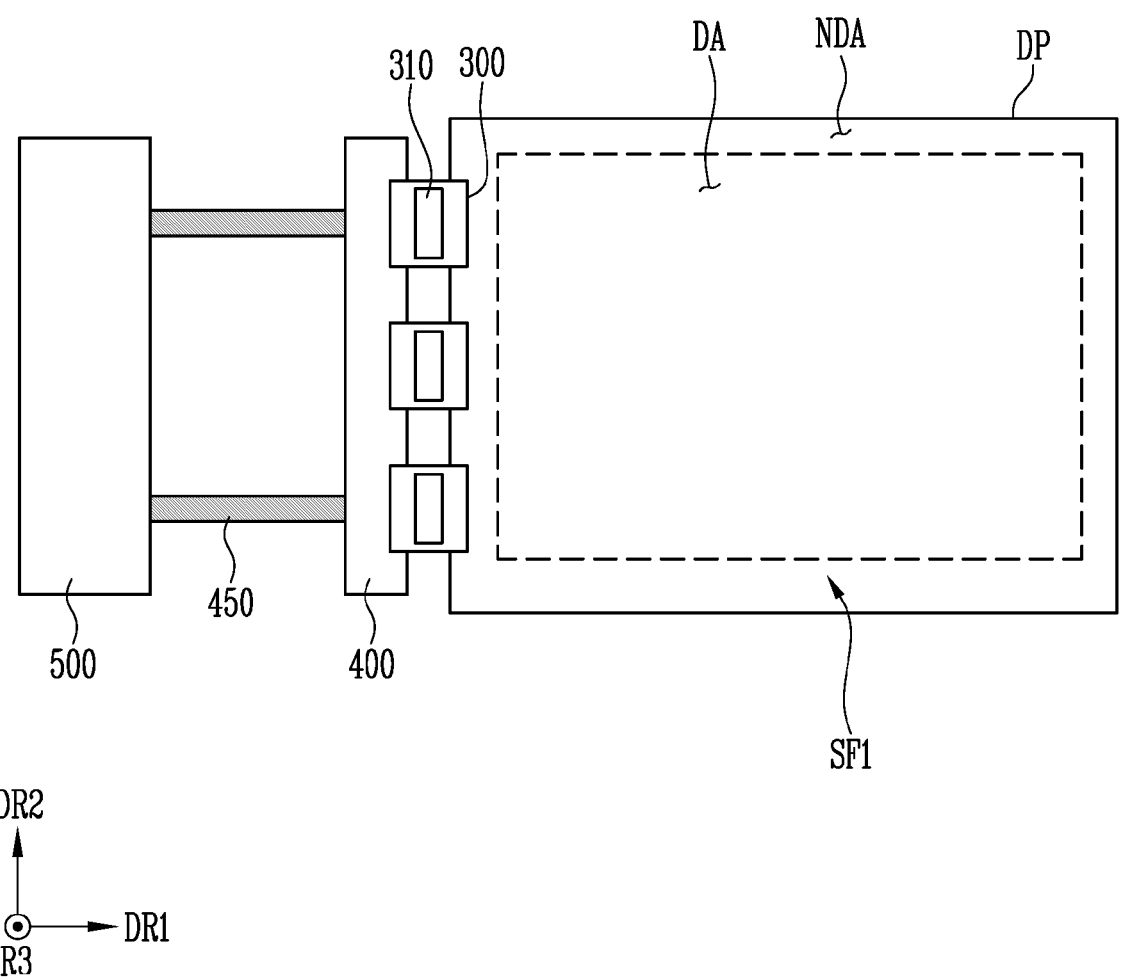
FIG. 3 is a schematic plan view illustrating a display panel in a display device according to an embodiment.
Figure 4:
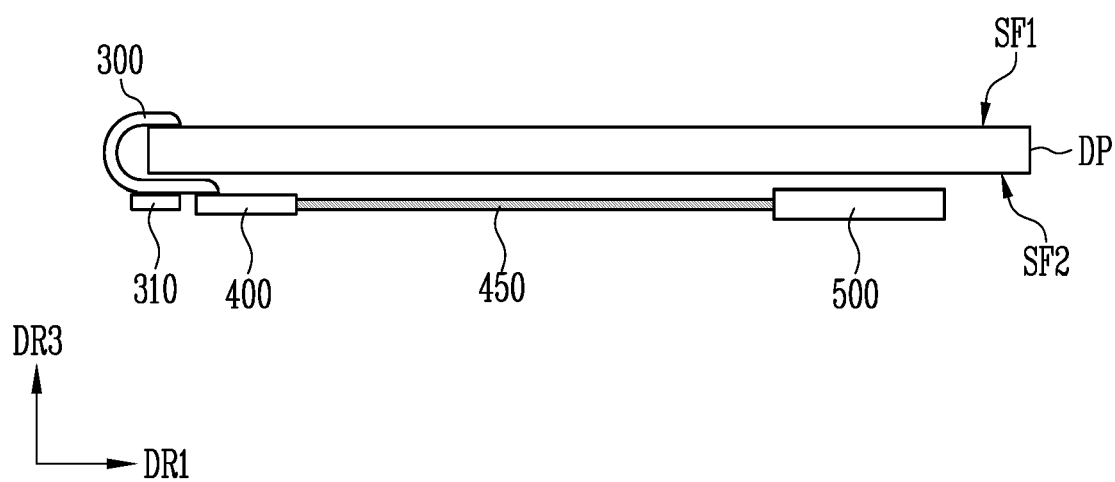
FIG. 4 is a schematic side view illustrating a connection film folded in the display device of FIG. 3.

Description of a display panel of a display device is provided with reference to FIGS. 3 and 4.

FIG. 3 is a schematic plan view illustrating a display panel in a display device according to an embodiment, and FIG. 4 is a schematic side view illustrating the connection film folded in the display device of FIG. 3.

Referring to FIGS. 3 and 4, the display device according to an embodiment may include a display panel DP, a connection film 300, a data driver 310, a printed circuit board 400, a cable 450, and a control board 500.

The display panel DP may display a display area DA in which an image is displayed and a non-display area NDA disposed around the display area DA. A surface of the display panel DP on which the display area DA is disposed may be referred to as a first surface SF1. Another surface of the display panel DP which is positioned opposite to the first surface SF1 and on which the display area DA is not disposed may be referred to as a second surface SF2.

Pixels may be provided in the display area DA, and the display area DA may display an image. The pixels may not be provided in the non-display area NDA, and the non-display area NDA may not display the image. In the non-display area NDA, a signal line, a voltage line, a pad, and the like, which provide a signal, a voltage, and the like to the pixels may be provided.

The connection film 300 may at least partially overlap a side of the display panel DP (or the non-display area NDA) in a plan view, and the data driver 310 may be mounted on the connection film 300. The data driver 310 may be a driver that provides a data voltage to the pixels on the display panel DP, and may receive a signal and/or voltage through the printed circuit board 400 and the control board 500. Description of the printed circuit board 400 and the control board 500 is provided below. The connection film 300 may be implemented with a flexible base member. In an embodiment, the connection film 300 may be a chip on film (COF), but the disclosure is not limited thereto.

The printed circuit board 400 may at least partially overlap a side of the connection film 300 in a plan view. The printed circuit board 400 may be physically and/or electrically connected to the connection film 300. In an embodiment, the printed circuit board 400 may be a flexible printed circuit board (FPCB), but the disclosure is not limited thereto.

The cable 450 may be positioned between the printed circuit board 400 and the control board 500, and may physically and/or electrically connect the printed circuit board 400 and the control board 500. The cable 450 may be electrically connected to the printed circuit board 400 and the control board 500 in a connector manner (or through a connector). Although the cable 450 is shown as two lines in FIG. 3, according to an embodiment, the cable 450 may be implemented with two or more lines according to a size, a type, and the like of the printed circuit board 400 and/or the control board 500.

The cable 450 may be implemented in various shapes capable of electrically connecting the printed circuit board 400 and the control board 500 according to positions of the printed circuit board 400 and the control board 500. In an embodiment, the cable 450 may be implemented in a flexible and flat cable shape. The cable 450 may include a spiral shape wound in a direction. The cable 450 may have a folding shape, which may be folded in a direction. In an embodiment, since the shape of the cable 450 is variously implemented according to the positions of the printed circuit board 400 and the control board 500, a space for mounting the cable 450 in the housing HS (refer to FIGS. 1 and 2) may be minimized, and a space of the rollable display device may be efficiently utilized.

The control board 500 may be spaced apart from the circuit board 400, and may be electrically connected to the circuit board 400 by the cable 450. The control board 500 may provide image data, a control signal, a power voltage, and the like to the display panel DP. For example, the control board 500 may include a timing controller that controls driving of the display panel DP, a power supply that supplies the power voltage to the display panel DP, and the like.

In an embodiment, when the connection film 300 disposed on a side of the display panel DP is folded in a third direction DR3, a portion of the connection film 300, the data driver 310, the printed circuit board 400, the cable 450, and the control board 500 may be disposed on the second surface SF2 of the display panel DP.

Description of a cable and a display device including the cable according to an embodiment is provided with reference to FIGS. 5 to 12.

Figure 5:
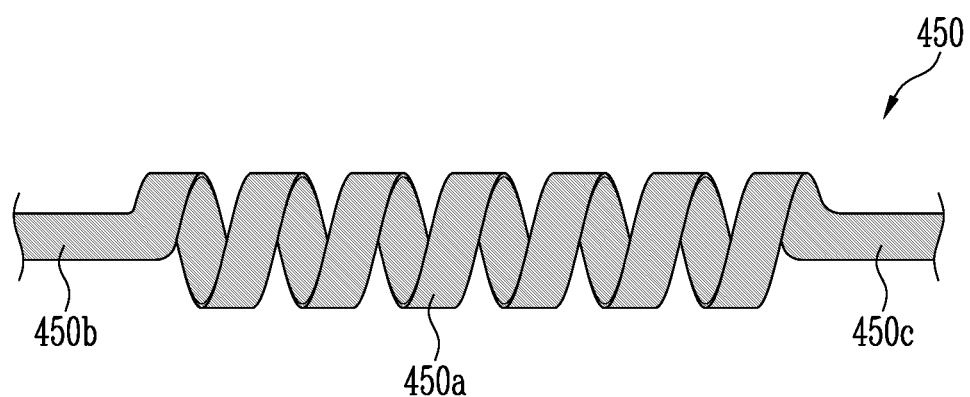
FIG. 5 is a schematic perspective view illustrating a cable of a display device according to an embodiment.
Figure 6:
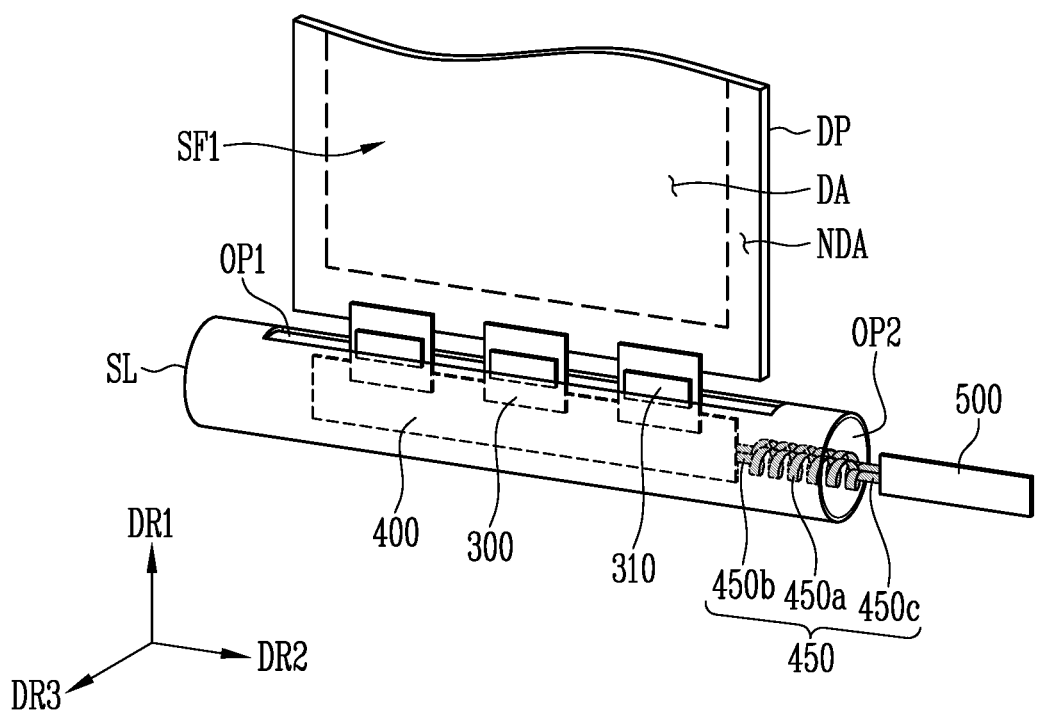
FIG. 6 is a schematic perspective view illustrating a display device including the cable of FIG. 5.
Figure 7:
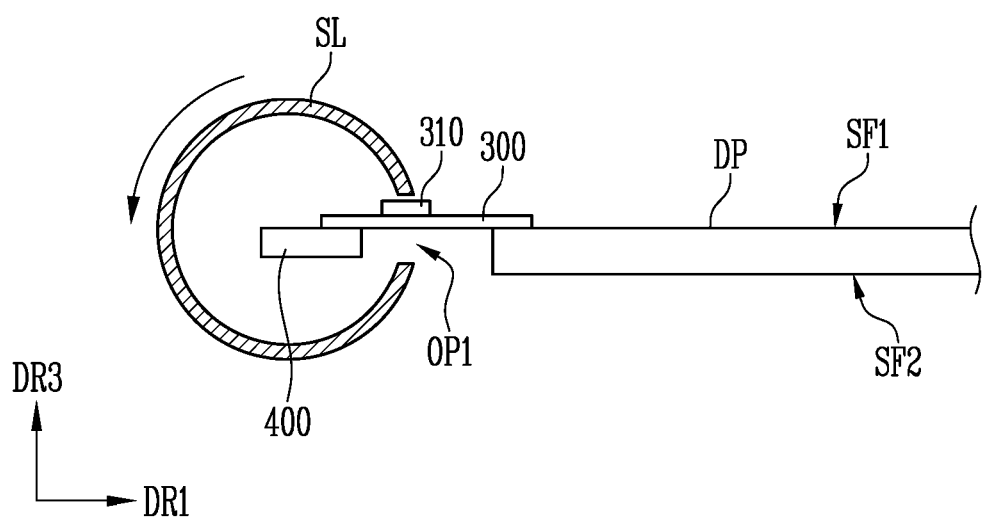
FIG. 7 is a schematic cross-sectional view of the display device of FIG. 6.
Figure 8:
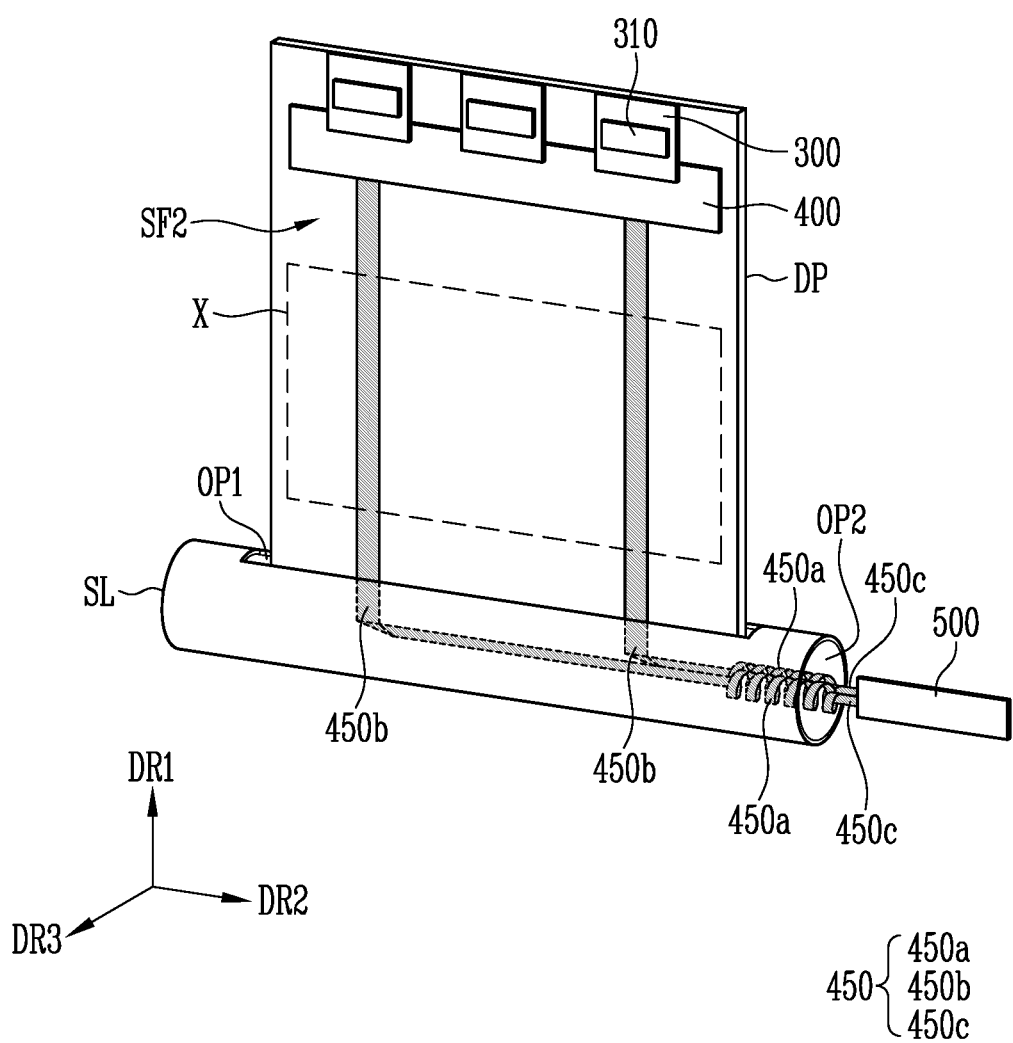
FIG. 8 is a schematic perspective view illustrating a display device including the cable of FIG. 5.
Figure 9:
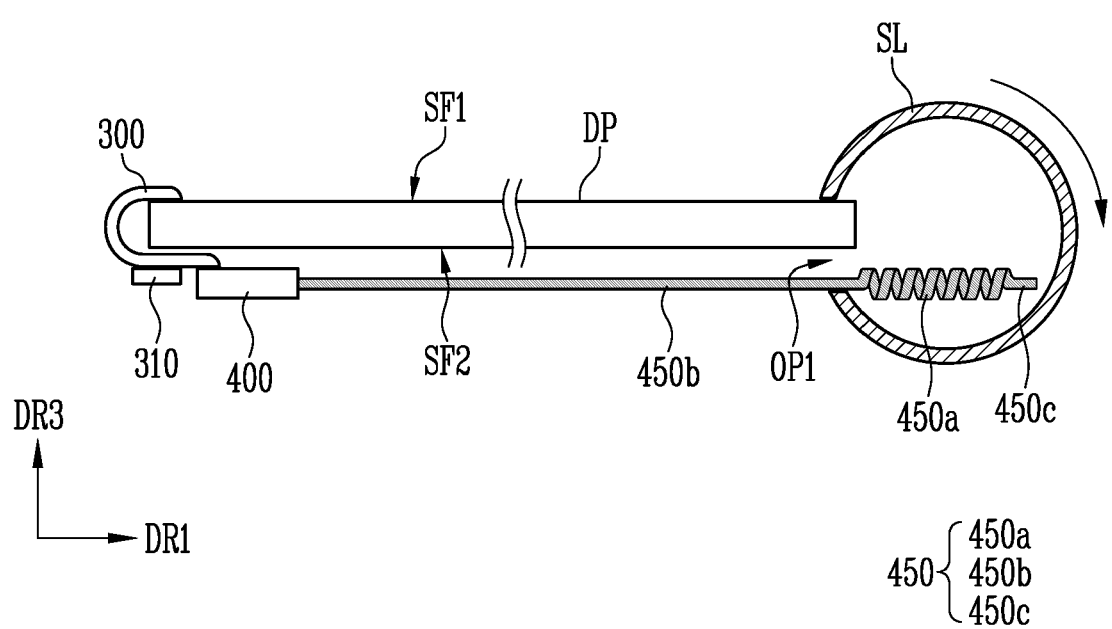
FIG. 9 is a schematic cross-sectional view of the display device of FIG. 8.
Figure 10:
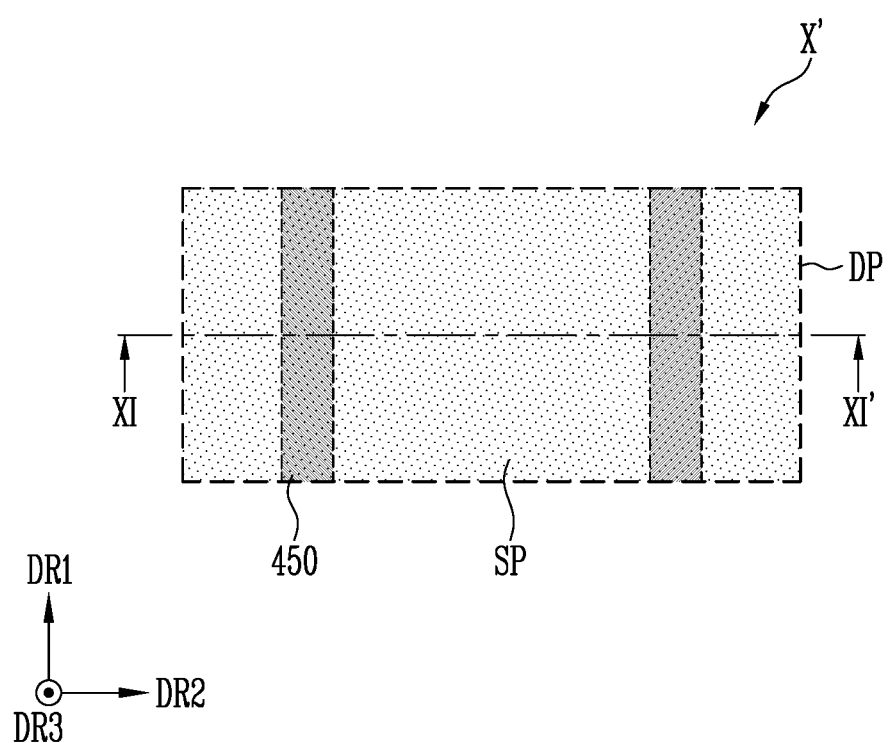
FIG. 10 is a schematic plan view illustrating area X' corresponding to an area X of FIG. 8.
Figure 11:
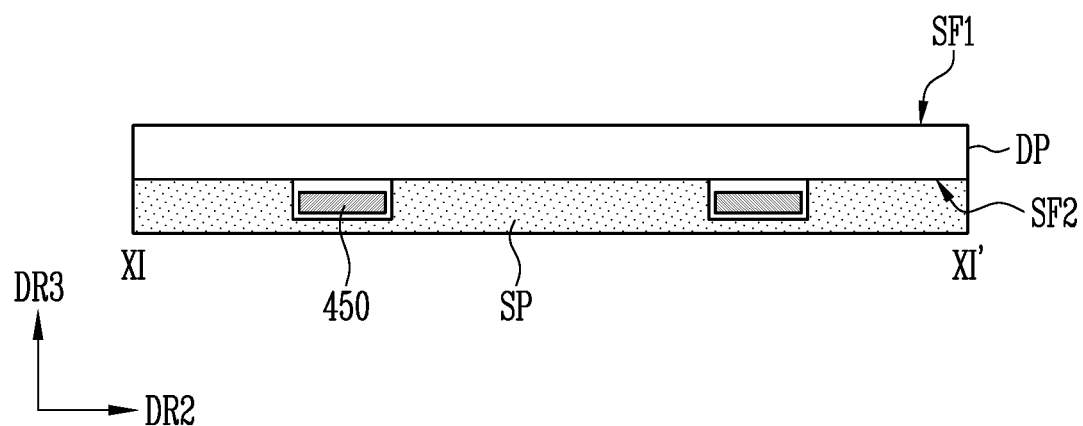
FIG. 11 is a schematic cross-sectional view taken along line XI-XI' of FIG. 10.
Figure 12:
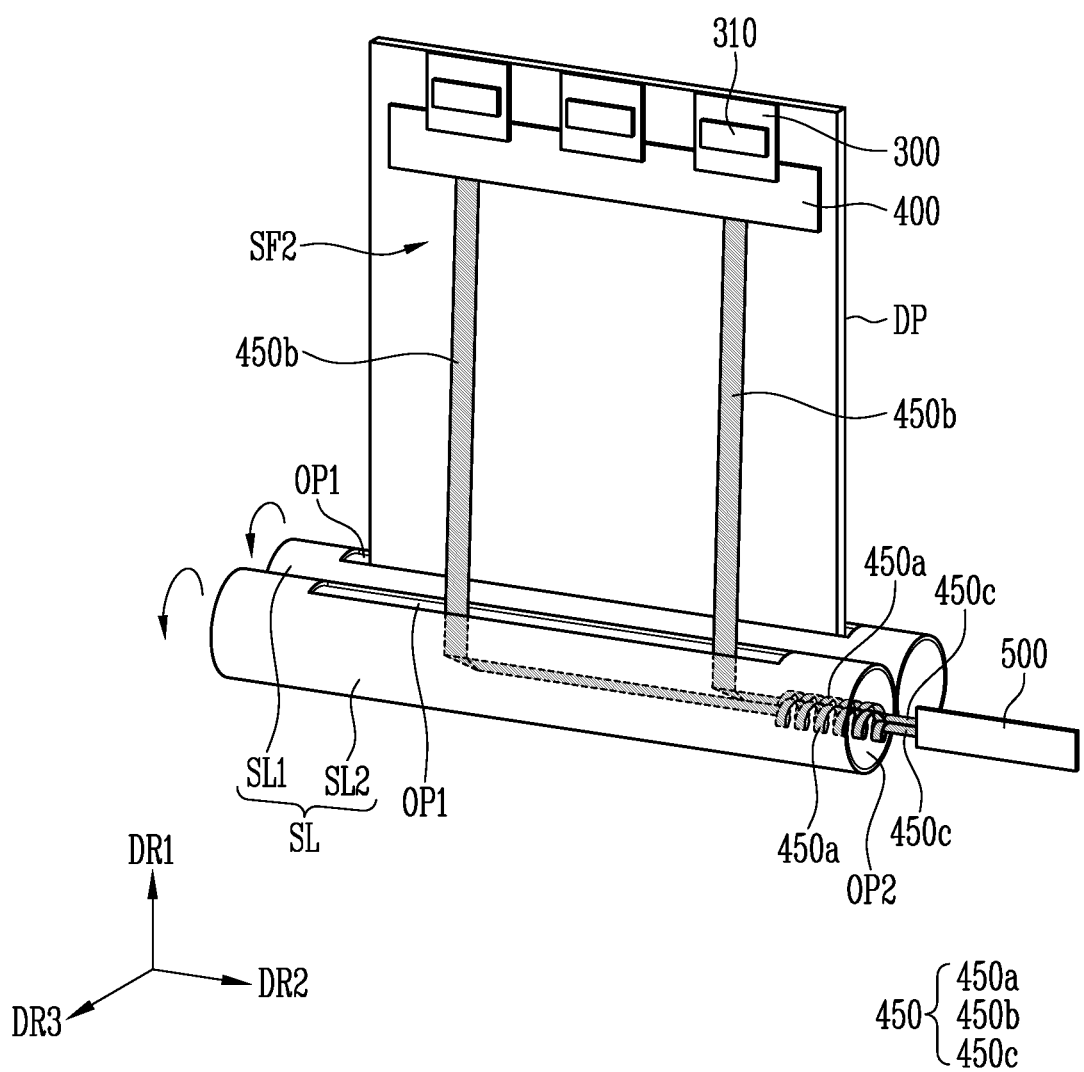
FIG. 12 is a schematic perspective view illustrating a display device including the cable of FIG. 5.

FIG. 5 is a schematic perspective view illustrating a cable of a display device according to an embodiment. FIG. 6 is a schematic perspective view illustrating a display device including the cable of FIG. 5. FIG. 7 is a schematic cross-sectional view of the display device of FIG. 6. FIG. 8 is a schematic perspective view illustrating a display device including the cable of FIG. 5. FIG. 9 is a schematic cross-sectional view of the display device of FIG. 8. FIG. 10 is a schematic plan view illustrating area X' corresponding to an area X of FIG. 8. FIG. 11 is a schematic cross-sectional view taken along line XI-XI' of FIG. 10. FIG. 12 is a schematic perspective view illustrating a display device including the cable of FIG. 5.

Referring to FIG. 5, the cable 450 according to an embodiment may include a curvature portion 450a having a spiral shape wound with a curvature in a direction, and straight line portions 450b and 450c extending in a straight line from the spiral shape (e.g., ends of the curvature portion 450a). The straight line portions 450b and 450c may include a first straight line portion 450b and a second straight line portion 450c extending straightly in different directions from the curvature portion 450a interposed therebetween. For example, the curvature portion 450a may be interposed between the first straight line portion 450b and the second straight line portion 450c.

Since the cable 450 may include a flexible material, and a size and a shape of the curvature portion 450a may be variously modified. For example, when a distance between the printed circuit board 400 and the control board 500 is short, the cable 450 may be disposed in a spiral shape having a first curvature. When the distance between the printed circuit board 400 and the control board 500 is long, the cable 450 may be disposed in a spiral shape having a second curvature, and may include a portion extending in a straight line without a curvature. The first curvature may be greater than the second curvature. Lengths of the first straight line portion 450b and the second straight line portion 450c may be variously modified. For example, when the distance between the printed circuit board 400 and the control board 500 is short, the length of the first straight line portion 450b and/or the second straight line portion 450c may be short. When the distance between the printed circuit board 400 and the control board 500 is long, the length of the first straight line portion 450b and/or the second straight line portion 450c may be long.

Referring to FIGS. 6 and 7, the connection film 300 and the printed circuit board 400 disposed on a side of the display panel DP may be positioned inside the cylinder SL. The control board 500 may be positioned outside the cylinder SL, and a position of the control board 500 may be variously changed inside the housing HS (refer to FIGS. 1 and 2) according to design of the display device.

The cylinder SL may include a first opening OP1 on an upper surface thereof. For example, the first opening OP1 of the cylinder SL may be disposed on a surface of the cylinder SL facing the first direction DR1. The connection film 300 and the printed circuit board 400 may be accommodated (or disposed) inside the cylinder SL through the first opening OP1. In case that the cylinder SL rotates in an arrow direction shown in FIG. 7, the second surface SF2 of the display panel DP may be wound or deployed along an outer surface of the cylinder SL. However, the disclosure is not limited thereto, and the first surface SF1 of the display panel DP may be wound or deployed along the outer surface of the cylinder SL according to a rotation direction of the cylinder SL.

The cylinder SL may include a second opening OP2 on a side surface thereof. For example, the second opening OP2 of the cylinder SL may be disposed on a surface facing the second direction DR2. The printed circuit board 400 may be electrically connected to the control board 500 through the second opening OP2.

The printed circuit board 400 may be electrically connected to the control board 500 through the cable 450. The first straight line portion 450b of the cable 450 may be positioned toward the printed circuit board 400 to be electrically connected to the printed circuit board 400, and the second straight line portion 450c of the cable 450 may be positioned toward the control board 500 to be electrically connected to the control board 500. For example, the first straight line portion 450b of the cable 450 may be disposed between the printed circuit board 400 and the curvature portion 450a of the cable 450, and the second straight line portion 450c of the cable 450 may be disposed between the control board 500 and the curvature portion 450a of the cable 450. The length of the second straight line portion 450c may be changed according to a position of the control board 500. A length and a shape of the curvature portion 450a of the cable 450 may be implemented in response to the number of rotations of the cylinder SL. In case that the cylinder SL rotates, the curvature portion 450a of the cable 450 may rotate together. Thus, the display panel DP may be wound or deployed along a surface of the cylinder SL.

Since the display device according to an embodiment may electrically connect the printed circuit board 400 and the control board 500 through the cable 450 having the spiral shape, a position of the printed circuit board 400 that partially overlaps the display panel DP in a plan view may be disposed at a lower end of the display panel DP. For example, the display device according to an embodiment may minimize the space for mounting the cable 450 in the housing HS (refer to FIGS. 1 and 2) and may efficiently utilize the space of the rollable display device.

Referring to FIGS. 8 and 9, a connection film 300 and a printed circuit board 400 disposed on a side of a display panel DP may be positioned outside a cylinder SL. A control board 500 may be positioned outside the cylinder SL, and a position of the control board 500 may be variously changed inside the housing HS (refer to FIGS. 1 and 2) according to the design of the display device.

A portion of the display panel DP may be accommodated (or disposed) inside the cylinder SL through a first opening OP1 of the cylinder SL. In case that the cylinder SL rotates in an arrow direction shown in FIG. 9, a second surface SF2 of the display panel DP may be wound or deployed along an outer surface of the cylinder SL. However, the disclosure is not limited thereto, and the first surface SF1 of the display panel DP may be wound or deployed along the outer surface of the cylinder SL according to a rotation direction of the cylinder SL.

A cable 450 may be positioned on a second surface SF2 of the display panel DP. Accordingly, in case that the cylinder SL rotates in the arrow direction shown in FIG. 9, the cable 450 may be wound or deployed along the outer surface of the cylinder SL together with the display panel DP.

The cable 450 may be positioned inside and outside the cylinder SL. The cable 450 may extend in a first direction DR1 through the first opening OP1, and may extend in a second direction DR2 through a second opening OP2. In case that the cable 450 extends in the first direction DR1 and the second direction DR2, a portion of the cable 450 may be disposed in a vertical shape. For example, in case that a first straight line portion 450b of the cable 450 extends in the first direction DR1 and the second direction DR2, a portion of the first straight line portion 450b may be disposed in a vertical shape in which a portion is bent. The first straight line portion 450b and a curvature portion 450a may be positioned inside the cylinder SL, and a second straight line portion 450c may be positioned in the second opening OP2.

The cable 450 may electrically connect the printed circuit board 400 and the control board 500. The cable 450 may extend in the first direction DR1 to be electrically connected to the printed circuit board 400, and may extend in the second direction DR2 to be electrically connected to the control board 500.

Since the display device according to an embodiment may electrically connect the printed circuit board 400 and the control board 500 through the cable 450 having the spiral shape, the position of the printed circuit board 400 that partially overlaps the display panel DP in a plan view may be disposed at an upper end of the display panel DP. For example, the display device according to an embodiment may minimize a space for mounting the cable 450 in the housing HS (refer to FIGS. 1 and 2) and may efficiently utilize a space of the rollable display device.

Referring to FIGS. 10 and 11, the display device according to FIGS. 10 and 11 may further include a support portion SP compared to the display device described with reference to FIGS. 8 and 9. Area X' of FIG. 10 corresponds to the area X shown in FIG. 8. Although the support portion SP is not included in FIGS. 8 and 9, positions of a display panel DP and a cable 450 in the area X' shown in FIG. 10 may be the same as the positions of the display panel DP and the cable 450 in the area X shown in FIGS. 8 and 9.

The cable 450 may be positioned on a second surface SF2 of a display panel DP. For example, a first straight line portion 450b of the cable 450 may be disposed to be spaced apart from the second surface SF2 of the display panel DP.

The support portion SP may be positioned on the second surface SF2 of the display panel DP. The support portion SP may cover the cable 450 and the second surface SF2 of the display panel DP. Accordingly, the support portion SP may prevent a step difference from being generated on the second surface SF2 of the display panel DP even though the cable 450 is positioned on the second surface SF2 of the display panel DP. The support portion SP may flatly implement (or planarize) the second surface SF2 of the display panel DP to protect the display panel DP from mechanical impact that may occur in case that the display panel DP is wound or deployed on the cylinder SL.

Referring to FIG. 12, the display device according to an embodiment may accommodate a display panel DP and a cable 450 in different cylinders SL. The display device of FIG. 12 is different from the display device of FIG. 8 in that the display panel DP and the cable 450 are accommodated (or disposed) in different cylinders SL.

The cylinder SL may include a first cylinder SL1 and a second cylinder SL2 adjacent in a third direction DR3.

The first cylinder SL1 may accommodate the display panel DP. Accordingly, the first surface SF1 of FIG. 4 of the display panel DP may be wound or deployed along an outer surface of the first cylinder SL1 in case that the first cylinder SL1 rotates. However, the disclosure is not limited thereto, and a second surface SF2 of the display panel DP may be wound or deployed along the outer surface of the first cylinder SL1 according to a rotation direction of the first cylinder SL1.

The second cylinder SL2 may accommodate the cable 450. In case that the second cylinder SL2 rotates, a first straight line portion 450b of the cable 450 may be accommodated (or disposed) inside the second cylinder SL2. The second cylinder SL2 and the first cylinder SL1 may rotate at a same speed, and the display panel DP and the cable 450 may be accommodated (or disposed) in the first cylinder SL1 and the second cylinder SL2, respectively. However, in consideration of lengths of the display panel DP and the cable 450, rotation speeds of the second cylinder SL2 and the first cylinder SL1 may be different.

Since the display device according to an embodiment may electrically connect the printed circuit board 400 and the control board 500 through the cable 450 having a spiral shape, the position of the printed circuit board 400 that partially overlaps the display panel DP in a plan view may be disposed at an upper end of the display panel DP. For example, the display device according to an embodiment may minimize a space for mounting the cable 450 in the housing HS (refer to FIGS. 1 and 2) and may efficiently utilize a space of the rollable display device.

Figure 13:
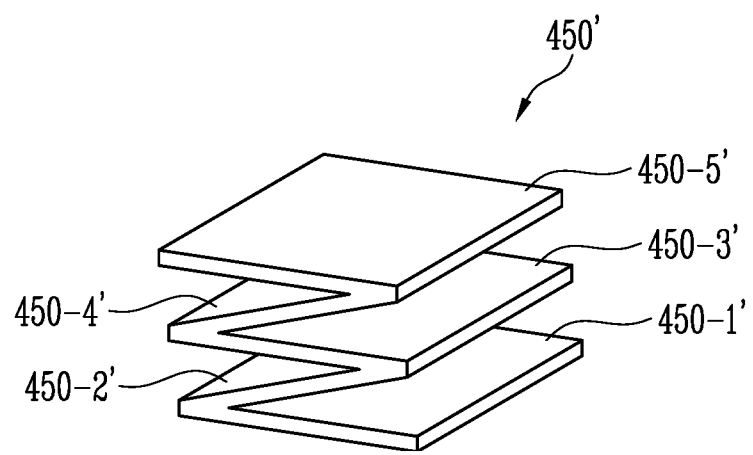
FIG. 13 is a schematic perspective view illustrating a cable of a display device according to an embodiment.
Figure 14A:
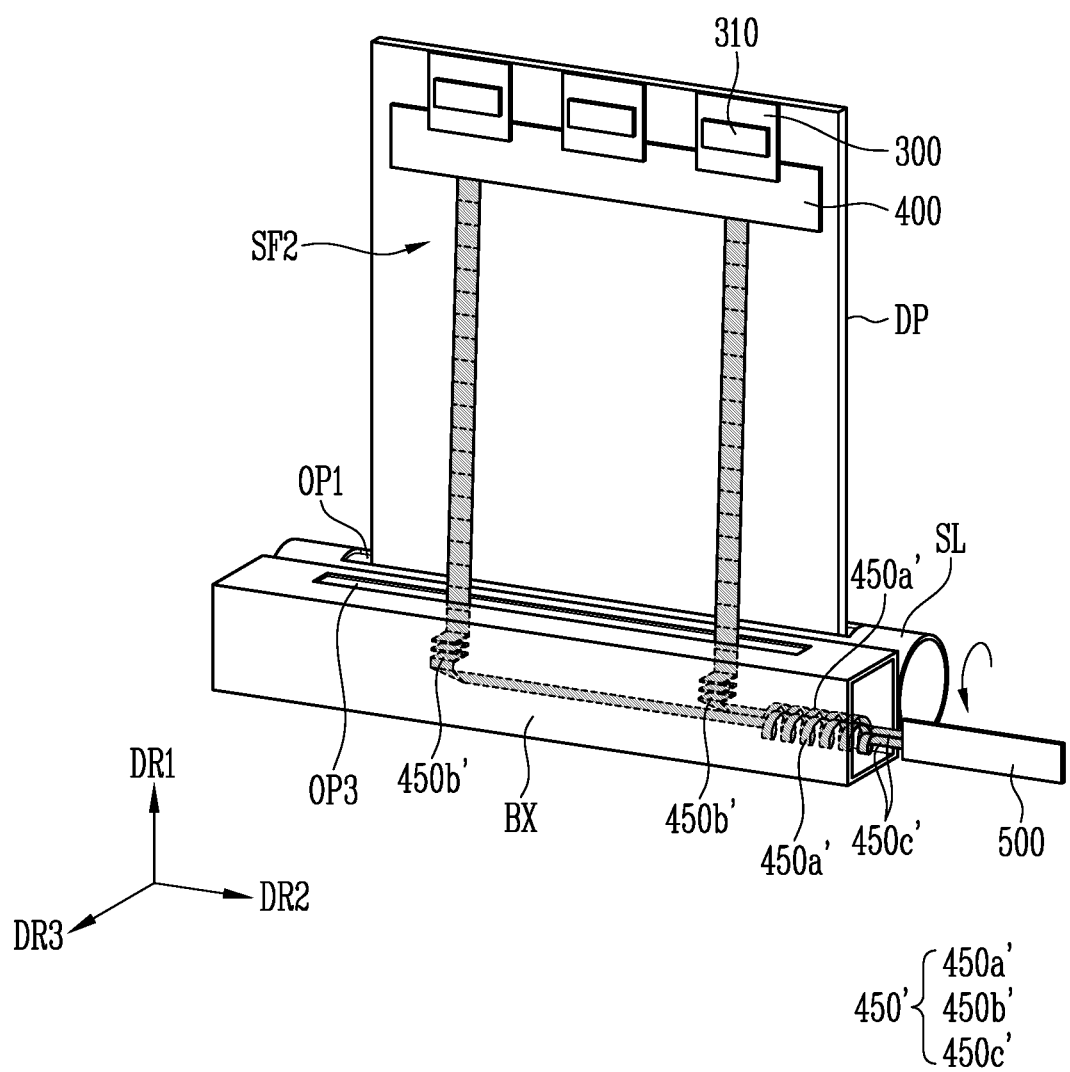
FIG. 14A is a schematic perspective view illustrating a display device including the cable of FIG. 13.
Figure 14B:
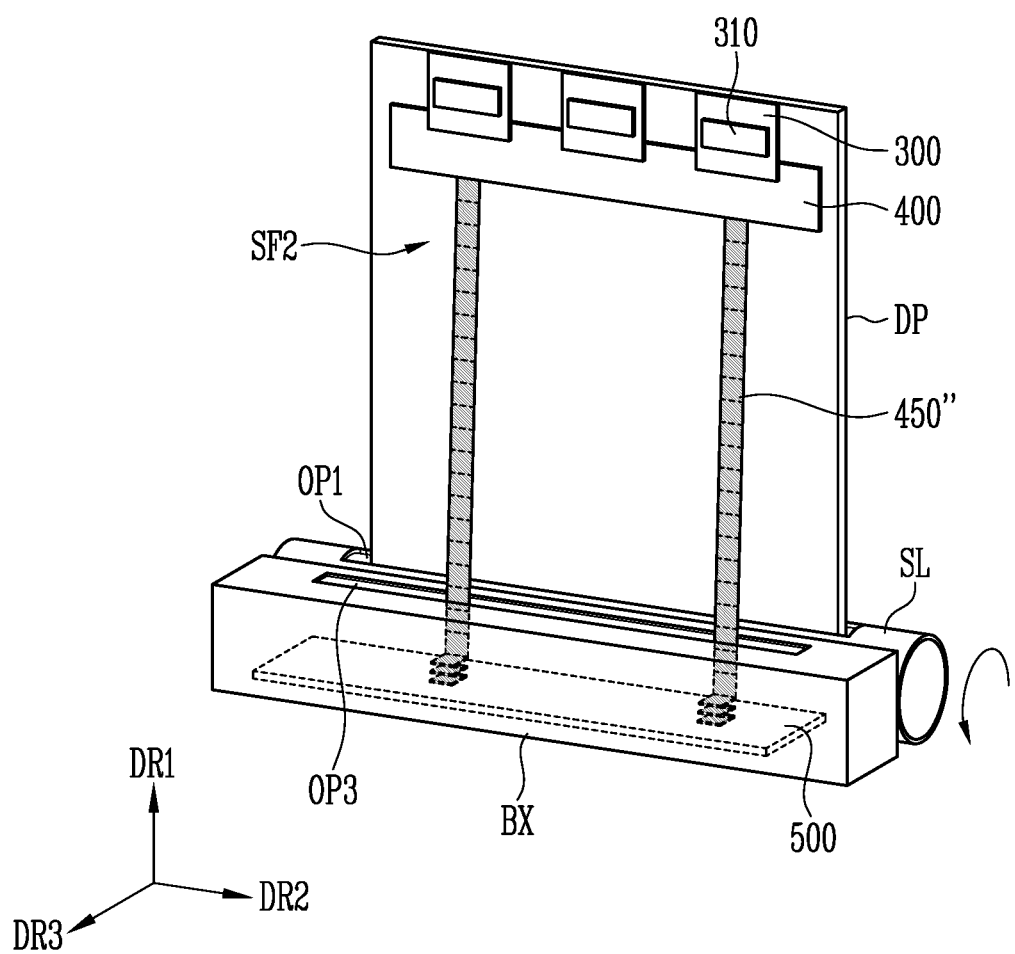
FIG. 14B is a schematic perspective view illustrating a display device including the cable of FIG. 13.

Description of a cable according to an embodiment and a display device including the cable is provided with reference to FIGS. 13, 14A, and 14B.

FIG. 13 is a schematic perspective view illustrating a cable of a display device according to an embodiment. FIGS. 14A and 14B are schematic perspective views illustrating a display device including the cable of FIG. 13.

Referring to FIG. 13, a cable 450' according to an embodiment may include a folding shape folded in a direction.

The cable 450' may include a first portion 450-1', a second portion 450-2', a third portion 450-3', a fourth portion 450-4', and a fifth portion 450-5'. In FIG. 13, the cable 450' may include only five portions, but the disclosure is not limited thereto, and the number of each portion may be variously changed according to a length of the cable 450'.

The cable 450' may include a fold line, and each portion may be folded along the fold line. For example, the first portion 450-1' may be folded inward, and the second portion 450-2' may overlap the first portion 450-1' of the cable 450' in a plan view. The third portion 450-3' may be folded outwardly and overlap the second portion 450-2' in a plan view. The fourth portion 450-4' may be folded inward and overlap the third portion 450-3' in a plan view. The fifth portion 450-5' may be folded outwardly and overlap on the fourth portion 450-4' in a plan view. A direction in which each portion of the cable 450' is folded is exemplary, and the folding direction may be variously changed according to an embodiment.

Multiple portions of the cable 450' may be folded to at least partially overlap in a plan view. For example, each of the portions may be folded to completely overlap each other, or each portion may be folded to partially overlap each other in a plan view.

In an embodiment, a magnetic treatment may be performed on a surface of the cable 450'. Accordingly, the cable 450' may be attached to and detached from an object having magnetism.

Referring to FIG. 14A, the display device according to an embodiment may accommodate a display panel DP in a cylinder SL and accommodate the cable 450' in an accommodating box BX. For example, the display panel DP may be accommodated (or disposed) in the cylinder SL, and the cable 450' may be accommodated (or disposed) in the accommodating box BX.

A connection film 300 and a printed circuit board 400 disposed on a side of the display panel DP may be positioned outside the cylinder SL. Accordingly, a portion of the display panel DP may be accommodated (or disposed) inside the cylinder SL through a first opening OP1 of the cylinder SL. In case that the cylinder SL rotates in an arrow direction shown in FIG. 14A, a first surface SF1 (refer to FIG. 4) of the display panel DP may be wound along an outer surface of the cylinder SL. However, the disclosure is not limited thereto, and a second surface SF2 of the display panel DP may be wound along the outer surface of the cylinder SL according to a rotation direction of the cylinder SL.

The cable 450' may extend in a first direction DR1, and be connected to the printed circuit board 400.

Referring to FIG. 14A, the cable 450' may extend in a second direction DR2 according to a position of a control board 500. The control board 500 may be positioned outside the cylinder SL and the accommodating box BX. The cable 450' may include a curvature portion 450a' having a spiral shape wound with a curvature in a direction and straight line portions 450b' and 450c' extending in a straight line from the spiral shape. The straight line portions 450b' and 450c' may include a first straight line portion 450b' and a second straight line portion 450c' extending in different directions from the curvature portion 450a' interposed therebetween. In an example, the control board 500 may be disposed outside the accommodating box BX, and the accommodating box BX may be manufactured to be relatively thin.

Referring to FIG. 14B, the cable 450" may extend in the first direction DR1 according to the position of the control board 500. The control board 500 may be positioned inside the accommodating box BX. In an example, the cable 450" may be identically applied to other configurations except for the curvature portion 450a' and the straight line portions 450b' and 450c' extending in the straight line from the spiral shape, which are included in the cable 450' shown in FIG. 14A.

The position of the control board 500 is not limited as shown in FIGS. 14A and 14B, but may be variously changed inside the housing HS (refer to FIGS. 1 and 2) according to the design of the display device.

The accommodating box BX may include a third opening OP3 on a surface thereof. For example, the third opening OP3 of the accommodating box BX may be disposed on a surface thereof in the first direction DR1. The cable 450' may be accommodated (or disposed) in the accommodating box BX through the third OP3 of the accommodating box BX.

The cables 450' and 450" may be positioned on the second surface SF2 of the display panel DP. In an embodiment, a metal sheet may be attached to the second surface SF2 of the display panel DP. Accordingly, in case that the display panel DP is accommodated (or disposed) in the cylinder SL, the cables 450' and 450", which are magnetically treated on the surface thereof, may be detached from the second surface SF2 of the display panel DP and may be accommodated (or disposed) in the accommodating box BX.

Since the display device according to an embodiment may electrically connect the printed circuit board 400 and the control board 500 through the cables 450' and 450" having a foldable shape, the position of the printed circuit board 400 that partially overlaps the display panel DP in a plan view may be disposed on an upper end of the display panel DP.

Although embodiments have been described for illustrative purposes, those skilled in the art will appreciate that various modifications, additions and substitutions are possible, without departing from the scope and spirit of the disclosure as described in the accompanying claims and their equivalents.

Accordingly, the above-described embodiments should be considered in descriptive sense only and not for purposes of limitation.

What is claimed is:

1. A display device comprising:
    a display panel which is flexible and includes:
        a first surface on which an image is displayed; and
        a second surface on which the image is not displayed;
    a connection film at least partially overlapping a side of the display panel in a plan view;
    a printed circuit board at least partially overlapping a side of the connection film in a plan view and electrically connected to the connection film;
    a control board spaced apart from the printed circuit board; and
    a cable electrically connecting the printed circuit board and the control board,
    wherein the cable has a spiral shape.

2. The display device according to claim 1, wherein the cable includes:
a curvature portion having the spiral shape;
a first straight line portion extending in a different direction from the spiral shape; and
a second straight line portion extending in a different direction from the spiral shape.

3. The display device according to claim 2, further comprising:
a housing accommodating the display panel; and
a cylinder positioned inside the housing, wherein
the cylinder winds and deploys the display panel.

4. The display device according to claim 3, wherein
the connection film and the printed circuit board are positioned inside the cylinder, and
the control board is positioned inside the housing.

5. The display device according to claim 4, wherein the cylinder includes:
a first opening on an upper surface of the cylinder; and
a second opening on a side surface of the cylinder,
the connection film and the printed circuit board are accommodated inside the cylinder through the first opening, and
the printed circuit board is electrically connected to the control board through the cable positioned in the second opening.

6. The display device according to claim 5, wherein
the first straight line portion and the curvature portion are positioned inside the cylinder, and
the second straight line portion is positioned in the second opening.

7. The display device according to claim 6, wherein
the first straight line portion is electrically connected to the printed circuit board, and
the second straight line portion is electrically connected to the control board.

8. The display device according to claim 3, wherein
the connection film and the printed circuit board are positioned outside the cylinder, and
the control board is positioned inside the housing.

9. The display device according to claim 8, wherein the cylinder includes:
a first opening on an upper surface of the cylinder; and
a second opening on a side surface of the cylinder,
the display panel is accommodated inside the cylinder through the first opening, and
the printed circuit board is electrically connected to the control board through the cable positioned in the second opening.

10. The display device according to claim 9, wherein the cable extends in a first direction through the first opening and extends in a second direction perpendicular to the first direction through the second opening.

11. The display device according to claim 10, wherein the first straight line portion extends in the first direction and the second direction and is disposed in a vertical shape.

12. The display device according to claim 11, wherein
the first straight line portion and the curvature portion are positioned inside the cylinder, and
the second straight line portion is positioned in the second opening.

13. The display device according to claim 9, wherein the first straight line portion is spaced apart from the second surface of the display panel.

14. The display device according to claim 13, further comprising:
a support portion covering the cable and the second surface of the display panel, wherein
the support portion is disposed on the second surface of the display panel.

15. The display device according to claim 8, wherein the cylinder includes:
a first cylinder accommodating the display panel; and
a second cylinder accommodating the cable.

16. A display device comprising:
a display panel which is flexible and includes:
a first surface on which an image is displayed; and
a second surface on which the image is not displayed;
a connection film at least partially overlapping a side of the display panel in a plan view;
a printed circuit board at least partially overlapping a side of the connection film in a plan view and electrically connected to the connection film;
a control board spaced apart from the printed circuit board; and
a cable electrically connecting the printed circuit board and the control board, wherein
the cable has a foldable shape,
the cable includes a plurality of portions,
each portion of the cable is folded along a fold line, and
the plurality of portions are folded to completely overlap each other in a plan view.

17. The display device according to claim 16, further comprising:
a housing accommodating the display panel; and
a cylinder positioned inside the housing, wherein
the cylinder winds and deploys the display panel, and
the connection film and the printed circuit board are positioned outside the cylinder.

18. The display device according to claim 17, further comprising:
an accommodating box that accommodates the cable.

* * * * *